US008243064B1

(12) United States Patent
Moravanszky et al.

(10) Patent No.: US 8,243,064 B1
(45) Date of Patent: Aug. 14, 2012

(54) SYSTEM FOR PROVIDING SCALABLE PHYSICS CONTENT

(75) Inventors: Adam Moravanszky, Zürich (CH);
Dennis Gustafsson, Norrkoping (SE);
Jean Pierre Bordes, St. Charles, MO (US); Peter Tchernev, Norrkoping (SE);
Bryan Richard Galdrikian, La Cañada, CA (US); Simon Schirm, Zürich (CH);
Dilip Sequeira, Seattle, WA (US);
Bruno Heidelberger, Zürich (CH);
Curtis Matthew Davis, Clayton, MO (US)

(73) Assignee: NVIDIA Corporation, Santa Clara, CA (US)

( * ) Notice: Subject to any disclaimer, the term of this patent is extended or adjusted under 35 U.S.C. 154(b) by 937 days.

(21) Appl. No.: 12/271,803

(22) Filed: Nov. 14, 2008
(Under 37 CFR 1.47)

Related U.S. Application Data

(60) Provisional application No. 60/988,170, filed on Nov. 15, 2007.

(51) Int. Cl.
*G06T 15/00* (2011.01)
(52) U.S. Cl. ........................................ 345/419; 345/473
(58) Field of Classification Search .......... 345/419–420, 345/473–475
See application file for complete search history.

(56) References Cited

U.S. PATENT DOCUMENTS

| 5,963,209 A * | 10/1999 | Hoppe ........................... 345/419 |
| 2005/0165873 A1 * | 7/2005 | Zhang et al. .................. 708/446 |
| 2006/0200327 A1 * | 9/2006 | Bordes .............................. 703/6 |

OTHER PUBLICATIONS

Karla, et al., "Real-Time Animation of Realistic Virtual Humans," IEEE Computer Graphics and Applications, Sep. 1998.
Debunne, et al., "Dynamic Real-Time Deformations Using Space & Time Adaptive Sampling," ACM SIGGRAPH 2001, Aug. 2001.
Reeves, Particle Systems—A Technique for Modeling a Class of Fuzzy Objects, ACM Transactions on Graphics, vol. 2, No. 2, Apr. 1983.
Desbrun, et al., "Smoothed Particles: A New Paradigm for Animating Highly Deformadable Bodies," Proceedings of the Eurographics Workshop on Computer Animation and Simulation, 1997.
Taubman, et al., "A Fast Fracture Method for Exploding Structures," SIGGRAPH '04 ACM SIGGRAPH 2004 Posters, 2004.
Office Action, U.S. Appl. No. 12/271,794, dated Nov. 2, 2012.

* cited by examiner

*Primary Examiner* — Xiao M. Wu
*Assistant Examiner* — Charles Tseng
(74) *Attorney, Agent, or Firm* — Patterson & Sheridan, LLP

(57) ABSTRACT

A physics software development kit (PSDK) provides scalable physics content as a "vertical" that defines one or more physics simulations for a graphics asset in a graphics scene. The vertical and the graphics asset may be provided in a verticals library associated with the PSDK or generated using the PSDK. The PSDK integrates the vertical into an existing graphics application to generate physically-realistic graphics content. The vertical may be scaled by a user according to the capabilities of a computer system that executes the PSDK or, alternatively, may be scaled by the PSDK based on received hardware capabilities information. The PSDK selectively off-loads the physics simulations associated with the vertical to a physics processing unit to optimize usage of processor resources. In addition, the PSDK provides a technique to extract a graphics asset based on an existing 3D model of the object. The graphics asset may then be simulated with a vertical to provide a physical simulation of the 3D model of the object.

23 Claims, 10 Drawing Sheets

SYSTEM FOR PROVIDING SCALABLE PHYSICS CONTENT

CROSS-REFERENCE TO RELATED APPLICATIONS

This application claims the priority benefit of provisional U.S. Patent Application Ser. No. 60/988,170, filed Nov. 15, 2007, the subject matter of which is hereby incorporated by reference.

BACKGROUND OF THE INVENTION

1. Field of the Invention

The present invention generally relates to physics processing and, more specifically, to a system for providing scalable physics content.

2. Description of the Related Art

An objective of conventional graphics engines is to generate highly-detailed computer graphics. Graphics engines, included in video games, computer aided-design (CAD) programs, simulation applications, and animation applications, among others, are configured to generate and display visual content. A developer produces computer graphics by writing a computer program that generates a two-dimensional (2D) or a three-dimensional (3D) virtual construct. In some cases, a computer program is written that generates a four-dimensional (4D) virtual construct, where time represents a fourth dimension in addition to three spatial dimensions. The developer uses the graphics engine to render an image that represents the virtual construct. The image may then be displayed on a computer screen.

Additionally, a developer may generate highly-detailed computer graphics by applying physical laws to the virtual construct to simulate the motion and/or properties associated with the virtual construct. The graphics engine may then be used to render images that appear physically realistic. For example, the virtual construct may be a pendulum, and the developer may simulate the motion of the virtual construct by applying the physical laws that govern pendulums to the virtual construct. The graphics engine may then be used to render a sequence of images that display physically realistic motion of the virtual construct.

However, several problems impede the productivity of developers. One problem with conventional techniques is that extensive programming knowledge is required to generate 2D, 3D, and 4D virtual constructs. Even when developers have a thorough understanding of programming, writing a computer program that generates a virtual construct to be rendered can be a laborious and time consuming process. Using conventional systems, each virtual construct in the virtual scene is programmed manually by the developer.

Another problem with conventional techniques is that computer programs written to generate and render virtual constructs may execute differently on different computing platforms or may not execute at all on a particular computing platform. One commonly implemented solution is to write several different versions of the computer program. Each version of the computer program is configured to generate and render a different version of the virtual construct. Depending on the capabilities of the computing platform, a particular version of the computer program may be selected to generate and render the virtual construct with a particular level of detail. However, requiring a developer to program multiple versions of the computer program and the virtual constructs further decreases the productivity of the developer.

Yet another problem with conventional techniques is that applying physical laws to virtual constructs significantly increases processor workload. Additionally, when these virtual constructs interact with one another, the interactions are also simulated by applying physical laws, further increasing the processor workload. As simulations include more interaction among virtual constructs, the number of physical calculations required increases dramatically. Since many computing platforms cannot handle the processing workload associated with physical simulations, the number of computing platforms capable of generating and rendering high-quality computer graphics is reduced.

Accordingly, there remains a need in the art for an improved technique for generating highly-detailed computer graphics that are physically accurate.

SUMMARY OF THE INVENTION

One embodiment of the present invention sets forth a method for generating a physical simulation involving one or more objects in a graphics scene. The method includes the steps of generating a first asset from a vertical, where the first asset is derived from the vertical and includes one or more physical parameters associated with a first object in the graphics scene, the physical parameters having respective values, and the vertical is configured to provide a physical simulation of the first object in the graphics scene when executed. The method also includes the steps of receiving a sampling resolution specifying a minimum size of time steps used to perform the physical simulation, integrating the vertical into a software application configured to generate the graphics scene, and generating an image of the graphics scene that includes the physical simulation of the first object based on the values of the physical parameters and on the sampling resolution.

Another embodiment of the present invention sets forth a method for generating an asset that is an instance of a vertical and includes at least one physical parameter associated with an object in a graphics scene, where the vertical is integrated into a software application to provide a physical simulation for the object in the graphics scene. The method includes the steps of extracting mesh data from a three dimensional model of the object that includes a plurality of rigid bodies, the mesh data defining one or more connections between different rigid bodies in the three dimensional model, and generating a rigid body hierarchy that identifies each of the rigid bodies in the three dimensional model. The method further includes the steps of estimating one or more physical parameters associated with at least one of the rigid bodies, and generating a physical model of the three dimensional model based on the rigid body hierarchy and the one or more physical parameters.

Yet another embodiment of the present invention sets forth a method for modifying a first level of detail (LOD) parameter associated with a vertical that defines one or more physical simulations for a graphics object contributing particles to a graphics scene. The method includes the steps of identifying the first LOD parameter associated with the vertical, where the value of the first LOD parameter influences the number of particles contributed to the graphics scene by the graphics object during the one or more physical simulations, and receiving a physics processing index (PPI) comprised of one or more components that indicates the capability of a first computer system to perform physical simulations. The method further includes the steps of generating a particles budget based on the PPI, where the particles budget defines a maximum number of particles to be included in the graphics scene, modifying the first LOD parameter to ensure that the total number of particles in the graphics scene upon execution of the one or more physical simulations on the computer system is less than the maximum number of particles defined by the particles budget, and providing the modified vertical, directly or indirectly, to a software application for rendering an image of the graphics scene for storage or display.

Additional embodiments of the present invention include computer-readable medium and systems configured to implement at least all or portions of the methods set forth above.

Advantageously, different verticals associated with a physics software development kit may be integrated into a user application without requiring extensive computer programming. Such functionality simplifies the overall application development process. Further, since verticals may be instanced as assets to provide physically realistic content, they can be easily implemented to generate effective, high-quality display images.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the invention. However, it will be apparent to one of skill in the art that the invention may be practiced without one or more of these specific details. In other instances, well-known features have not been described in order to avoid obscuring the invention.

Figure 1:
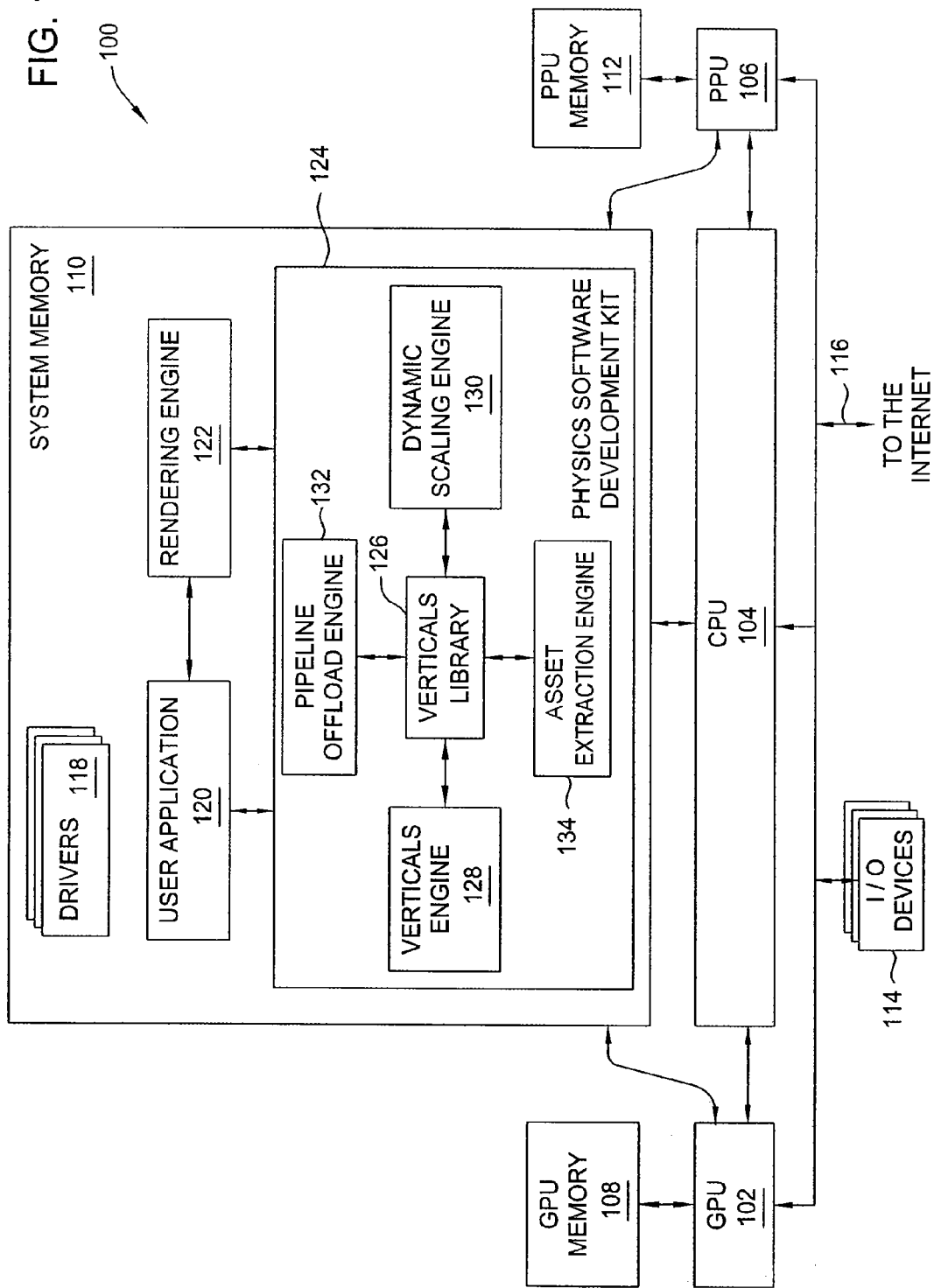
FIG. 1 is a block diagram illustrating a computer system configured to implement one or more aspects of the invention.

FIG. 1 is a block diagram illustrating a computer system 100 configured to implement one or more aspects of the invention. As shown, the computer system 100 includes a graphics processing unit (GPU) 102, a central processing unit (CPU) 104, a physics processing unit (PPU) 106, a GPU memory 108, a system memory 110, a PPU memory 112, one or more input/output (I/O) devices 114, and an internet connection 116. The GPU 102, the CPU 104, the PPU 106 and the I/O devices 114 are each associated with one or more drivers 118 stored in the system memory 110. The drivers 118 are software programs that may be executed by the various processing units of the computer system 100, including the GPU 102, the CPU 104, the PPU 106, and the I/O devices 114 to translate program instructions into machine code. For example, the PPU 106 may execute the driver 118 associated with the PPU 106 to translate program instructions into machine code native to the PPU 106.

The CPU 104 is the primary processor in the computer system 100 and is configured to execute software programs to implement the various functions of the computer system 100. The CPU 104 is coupled to the system memory 110. The system memory 110 stores the software programs that may be executed by the CPU 104 including the drivers 118, a user application 120, a rendering engine 122, and a physics software development kit (PSDK) 124. The user application 120, the rendering engine 122, and the PSDK 124 cooperate to generate physically accurate computer graphics, as further described in FIGS. 2-10. When executing these software programs, the CPU 104 may read data from or write data to the system memory 110. Additionally, the CPU 104 is coupled to the GPU 102 and to the PPU 106.

The GPU 102 and the PPU 112 are co-processors that supplement the processing capabilities of the CPU 104. The GPU 102 increases the graphics processing capabilities of the computer system 100. In one embodiment, the computer system 100 includes multiple GPUs that operate in concert or independently to perform graphics processing operations. The GPU 102 is coupled to the GPU memory 108 and to the system memory 110. The GPU 102 executes software programs stored in the GPU memory 108 or the system memory 110. The GPU 102 reads data from and/or writes data to the GPU memory 108 and/or to the system memory 110 when executing software programs. The software programs executed by the GPU 108 configure various hardware components (not shown) within the GPU 102 to perform different graphics processing tasks. The GPU 102 is accessible by software programs executing on the CPU 104 and/or the PPU 106. For example, the rendering engine 122 may access the GPU 102 to perform graphics processing operations.

The PPU 106 is a specialized processing unit that performs physics calculations to increase the physics processing capabilities of the computer system 100. The PPU 106 may be, for example, a PhysX™ chip. The PPU 106 may be integrated into the computer system 100 or, alternatively, may be located on an add-in card coupled to the computer system 100. In one embodiment, the computer system 100 includes multiple PPUs that operate in concert or independently to perform physics processing operations. The PPU 106 is coupled to the PPU memory 112 and to the system memory 110. The PPU 106 executes software programs stored in the PPU memory 112 and/or the system memory 110. The PPU 106 reads data from and/or writes data to the PPU memory 112 and/or the system memory 110 when executing software programs. The software programs executed by the PPU 106 may configure various hardware components (not shown) within the PPU 106 to perform different physics processing tasks. The PPU 106 is accessible by software programs executing on the CPU 104 and/or the GPU 102. For example, the PSDK 124 may access the PPU 106 to perform physics processing operations.

In one embodiment, the GPU 102 and the PPU 106 are integrated onto a single chip that provides both graphics processing and physics processing functionality. In another embodiment, the GPU 102, the CPU 104 and the PPU 106 are integrated onto a single chip that performs graphics processing operations, general processing operations, and physics processing operations for the computer system 100. Various other configurations are also within the scope of embodiments of the invention.

The GPU 102, the CPU 104, and the PPU 106 are each connected to the I/O devices 114. The I/O devices 114 include input devices, such as a keyboard, a mouse, a video game controller, a microphone, a touchpad, a scanner, a stylus, a CD-ROM drive, and a DVD drive, among others. The I/O devices 114 also include output devices, such as a cathode-ray tube (CRT) monitor, a liquid crystal display (LCD) monitor, a printer, and a speaker, among others. The GPU 102, the CPU 104, and the PPU 106 receive data from the I/O devices 114 and transmit data to the I/O devices 114. Data received from the I/O devices 114 may be stored in the GPU memory 108, the system memory 110, and/or the PPU memory 112.

The GPU 102, the CPU 104, and the PPU 106 may access the Internet via internet connection 116. The internet connection 116 may be an Ethernet connection, a cable connection, a wireless connection, or a telephone connection. When the internet connection 116 is implemented as an Ethernet connection, the computer system 100 includes an Ethernet controller. The GPU 102, the CPU 104, and the PPU 106 may download data from or upload data to remote computing systems and/or external memory units via the internet connection 116. The data downloaded via the internet connection 116 may be stored in the GPU memory 108, the system memory 110, and/or the PPU memory 112.

Data stored in the system memory 110 is processed by the user application 120, the rendering engine 122, and the PSDK 124. When executed by the CPU 104, the user application 120, the rendering engine 122, and the PSDK 124 perform different processing steps on the data stored in the system memory 110 to generate computer graphics, which may then be output to the I/O devices 114.

The user application 120 is typically an interactive software program that uses the rendering engine 122 and the PSDK 124 to generate an image that may be displayed using one or more of the I/O devices 114. A user may interact with the user application 120 to modify the generated image via the I/O devices 114.

For example, the user application 120 may be a video game, and the image may be a "level" within that video game. The level may include a character controlled by the user via I/O devices 114. The user may navigate the character through the level by inputting commands via the I/O devices 114. As the character moves through the level, the image that represents the level is updated to reflect the movement of the character. The user application 120 may also be implemented as other types of interactive software programs, such as a computer-aided design (CAD) program, an animation application, and a simulation application, among others.

The user application 120 accesses the rendering engine 122 to generate pixels that make up the image. The pixels may then be output to a display device. The rendering engine 122 may implement a variety of rendering approaches, including ray tracing, ray casting, radiosity, and rasterization. The rendering engine 122 may be implemented as a software rendering engine or the rendering engine 122 may be implemented as a hardware rendering engine. The rendering engine 122 may also be implemented as a combination of software and hardware. The rendering 122 may offload graphics processing tasks onto the GPU 108 and may offload physics processing tasks to the PPU 106 to increase processing efficiency.

The PSDK 124 is a software program that is configured to provide scalable physics simulations, referred to herein as "verticals," to the user application 120 and the rendering engine 122. A physics simulation is a mathematical model of one or more objects that describes the motion of those objects relative to a particular reference point. The reference point could be, for example, the origin of a 3D Cartesian coordinate system. The PSDK 124 includes a verticals library 126, a verticals engine 128, a dynamic scaling engine (DSE) 130, a pipeline offload engine (POE) 132, and a asset extraction engine (AEE) 134. The DSE 130, the POE 132, and the AEE 134 are described in greater detail below in FIGS. 4-10.

The verticals library 126 includes a plurality of verticals. Each vertical is configured to load one or more virtual objects that represent real-world or imaginary objects into a region of the system memory 110 that is managed by the vertical. The virtual objects may be loaded from any accessible storage media, such as a magnetic disk drive or a compact disc. The vertical provides a simulation of the motion and interaction of the virtual objects by applying physical laws to each virtual object loaded into the vertical. The vertical is also configured to load a set of physical parameters that define the physical properties of the loaded virtual objects. These physical parameters may also be loaded from any accessible storage media. Physical parameters may include, for example, mass, volume, or density. The physical parameters may be used to perform various physics computations associated with the virtual objects. The virtual objects and the physical parameters collectively define an "asset" that is loaded by the vertical to generate a physical simulation. The vertical may load different assets to generate simulations that represent different real-world or imaginary objects.

The overall level of detail (LOD) of a vertical may be scaled by adjusting different LOD parameters associated with each vertical. The LOD parameters may be adjusted according to user input to generate a more-detailed or less-detailed physical simulation depending on the degree to which the LOD parameters are modified. When the LOD parameters of the vertical are adjusted, the vertical scales the assets accordingly to generate a new simulation based on the adjusted LOD parameters. The vertical may also be configured to adjust the LOD parameters of each asset loaded into the vertical independently of the other assets loaded into the vertical. The PSDK 124 is configured to generate a LOD parameters UI (not shown) that allows a user to manipulate the LOD of different verticals and/or assets, as further described in FIG. 3. Additionally, the appearance of a vertical may be altered without affecting the physical simulation of the vertical. This feature allows real-world objects with different appearances that have the same physical properties to be simulated using different versions of a single vertical.

Each vertical in the verticals library 126 may be integrated into the user application 120. When a vertical is integrated into the user application 120, the vertical may load and simulate one or more assets. The rendering engine 122 may then be used to generate an image that includes assets associated with some or all of the verticals integrated into the user application 120. The simulated assets appear physically realistic, resulting in the generated images appearing physically realistic.

The verticals library 126 may provide access to a wide variety of pre-existing verticals and associated assets, as described in greater detail herein.

A vertical may be scaled based on a type associated with the vertical. One type of vertical stored in the verticals library 126 is a destructible mesh vertical. The destructible mesh vertical is configured to load a destructible mesh asset that is simulated by the destructible mesh vertical to represent the destruction of a virtual object into fragments. The destructible mesh asset describes the physical appearance and properties of the virtual object. For example, the destructible mesh vertical may load an asset that represents a wall. The wall asset includes physical properties that are incorporated into the physical simulation provided by the destructible mesh vertical. The destructible mesh vertical may then be integrated into a user application such as a video game, and the destructible mesh asset then provides a wall that could be destroyed. A virtual character in the video game may fire a weapon at the wall and create an explosion that destroys the wall or a portion of the wall. The destructible mesh vertical could simulate different sized fragments being ejected from the wall by the explosion. The destructible mesh vertical simulates the trajectory of each fragment by applying physical laws to each fragment. The destructible mesh vertical may also load multiple destructible mesh assets that represent different virtual objects that may be destroyed. For example, the destructible mesh vertical may load a wall asset, a barricade asset, a fence asset, and a door asset that may each be simulated with the destructible mesh vertical.

Each destructible mesh asset may be simulated by the destructible mesh vertical with various levels of detail, according to a user specification. The LOD of fragments ejected by a destructible mesh asset may be controlled by a fragment LOD parameter. For example, the user may scale the LOD of the fragments ejected by a wall asset by modifying the fragment LOD, causing fewer or more fragments to be ejected from the wall. When the LOD is decreased, fewer calculations would be required to simulate the fragments ejected from the wall. Similarly, the user may also increase the fragment LOD so that additional fragments are ejected from the wall, thus providing additional detail.

In one embodiment, the destructible mesh vertical scales the LOD of the fragments generated by the destructible mesh asset using a fragmentation hierarchy. The fragmentation hierarchy defines different fragmentation levels of the destructible mesh asset, as described herein. Returning to the wall example, when the wall is destroyed, a first group of fragments is generated, corresponding to a first fragmentation level. A subset of the fragments in the first group may then be destroyed to generate a second group of fragments that are smaller than the fragments in the first group. The second group of fragments corresponds to a second fragmentation level. A subset of the fragments in the second group may then be destroyed to generate a third group of fragments that are smaller than the fragments in the first and second groups. The third group of fragments corresponds to a third fragmentation level. This fragmentation process may occur until the smallest possible fragment size (highest fragmentation level) is reached.

The fragment LOD determines the fragmentation level of the wall, thereby determining how many fragments are simulated. In one embodiment, the fragment LOD is set to a minimum value (corresponding to minimum detail), and only the first group of fragments is generated when the wall is destroyed. Thus, only the fragments in the first group are simulated. Alternatively, when the fragment LOD is set to a maximum value (corresponding to maximum detail), then every group of fragments is generated, from the lowest fragmentation level to the highest fragmentation level. All of these fragments are then simulated. The number of physics calculations required to simulate the destruction of the wall is related to the number of fragments generated when the wall is destroyed. Accordingly, scaling the fragmentation level of the wall also scales the number of physical computations required to simulate the wall exploding. In this fashion, the processing workload of the CPU 104 and/or the PPU 106 may be reduced or increased as desired.

In another embodiment, the fragment LOD represents a probability that fragments generated by the destructible mesh asset crumble. For example, when the fragment LOD is set to zero, fragments ejected from the wall do not crumble. If the fragment LOD is greater than zero, then some or all of the fragments ejected from the wall crumble. Additional fragments generated by crumbling fragments may also crumble according to the fragment LOD. The destructible mesh vertical simulates a crumbling fragment as a collection of "oriented particles" that are each modeled as a separate point mass having position, orientation, linear velocity and angular velocity. Each oriented particle is rendered as a polygonal mesh instead of a rigid body, thus avoiding the computational load associated with simulating additional rigid bodies.

In yet another embodiment, the fragment LOD represents the lifetime of each fragment generated by the destructible mesh asset. In the wall example, if the fragment LOD is set to 4 seconds, then the fragments generated by the exploding wall persist within the simulation for 4 seconds. Afterwards, these fragments are removed from the simulation and do not require additional physical simulation.

In a further embodiment, some or all of the aforementioned techniques for modifying the fragment LOD of a destructible mesh vertical may be combined to provide a composite fragment LOD that controls the LOD of an asset associated with that vertical. This composite fragment LOD may include various sub-parameters. For example, the fragment LOD could include a crumble chance LOD setting that defines the probability that each fragment crumbles into smaller fragments and, additionally, a chunk lifetime LOD that defines the lifetime of each fragment generated. Other combinations are also possible.

Another type of vertical stored in the verticals library 126 is the emitter vertical. The emitter vertical loads an emitter asset and may then be integrated into the user application 120. The emitter vertical is configured to eject different types of particles into a virtual scene generated by the user application 120 according to each emitter asset that is loaded. An emitter asset ejects particles from a particular location within the virtual scene. For example, if the virtual scene generated by the user application 120 included a waterfall, the emitter vertical could load a waterfall asset and eject water particles from the top of the waterfall. The emitter asset may be configured to eject different particles that may have a variety of visual qualities and may be used to simulate a variety of visual effects depending on the particular loaded asset. A given asset causes the emitter vertical to eject particles at a particular rate and for a particular duration of time. The ejected particles are simulated by applying physical laws to each particle.

The emitter vertical can be used to generate dynamic effects such as a muzzle flash of a weapon being fired, wind-blown debris, fluid leaking from a container, and widespread atmospheric effects, such as rain or snow. The emitter vertical may also be used to generate static features of a virtual scene generated by the user application 120. For example, the emitter vertical could be used to generate a pile of rocks when a rock pile asset is loaded. The emitter vertical may also be used to generate randomly organized particles, or may be used to generate particles according to a predefined pattern. For example, the emitter vertical can be used to generate evenly spaced rows of cans on a shelf in a virtual supermarket. The LOD of the emitter vertical can be scaled to adjust the rate at which particles are ejected, the duration of time during which the particles are ejected, and/or the density of the particles.

In one embodiment, the emitter vertical is capable of ejecting other verticals. For example, an emitter vertical within a video game could eject destructible mesh verticals that each simulates a different asset. When the simulated assets impact the ground of the virtual scene created by the video game, each asset may be destroyed according to the simulation provided by the destructible mesh vertical.

A fourth type of vertical is a conglomerate vertical that combines several different assets. For example, a conglomerate vertical may combine two or more different verticals to represent a tree with falling leaves. The trunk and branches of the tree may be generated using destructible mesh assets, while the falling leaves may be generated using an emitter asset that continuously ejects leaves. Other combinations of assets are also possible.

When the PSDK 124 performs physics simulations using the verticals stored in the vertical library 126, physics calculations may be performed using the GPU 102, the CPU 104 and/or the PPU 106. Since the PPU 106 is specialized to perform physics processing calculations, the PSDK 124 is optimized for use with a PPU 106, such as a PhysX™ chip.

The verticals engine 128 allows a developer to author additional assets and integrate verticals with the additional assets directly into the user application 120 without manually programming the assets. Each additional asset includes a set of LOD parameters that can be modified by a vertical when the asset is loaded into the vertical. The developer authors the additional asset using a maximum LOD parameter setting for each LOD parameter. When the vertical loads the assets and is integrated into the user application 120, the verticals engine 128 causes the vertical to scale down the simulation associated with the asset according to hardware performance capabilities or other criteria. The verticals engine 128 also allows a developer to author additional verticals and store these additional verticals in the verticals library 126.

The verticals engine 128 generates a vertical by receiving input that specifies the type of vertical to be generated. The type of vertical could be, for example, a destructible mesh type or an emitter type, among others. The verticals engine 128 then receives input that specifies the physical parameters associated with the vertical and generates an asset that can be loaded into the vertical. One example of a physical parameter included in the asset could be a volume physical parameter that defines the volume of a wall asset associated with a destructible mesh vertical. The verticals engine 128 also receives input specifying a set of LOD parameters that may be manipulated to scale the LOD of the vertical and one or more assets loaded by the vertical. The LOD parameters may include physical parameters, such as mass or volume, or alternatively the LOD parameters may specify attributes associated with the specific type of vertical. For example, a LOD parameter associated with a destructible mesh vertical could be fragmentation level or, alternatively, a LOD parameter associated with an emitter may be particle density. The LOD parameters associated with a given vertical may affect the LOD parameters of all of the assets loaded into the vertical, or may affect each asset independently.

In one embodiment, the verticals engine 128 also receives input that specifies the type of physical effect predominantly simulated by the vertical. While a particular vertical may perform physical simulations that include rigid body simulations, fluid simulations, cloth simulations, or other types of physical simulations, the functionality of the vertical may depend more on one type of physical simulation relative to the other types of simulations. For example, an emitter could emit rigid bodies and a few fluid particles. In such a case, the emitter vertical would be identified as performing a predominantly rigid body simulation, as opposed to a fluid simulation. Alternatively, the emitter vertical could be configured to emit fluid particles and a few rigid bodies. The emitter vertical would then be identified as performing a predominantly fluid simulation.

Once the vertical and an associated asset is defined, the verticals engine 128 stores the vertical and the asset in the verticals library and then integrates the vertical with the asset loaded into the user application 120. The verticals engine 128 may then expose a LOD parameters user interface (UI) that allows the selected LOD parameters of the asset to be adjusted. The verticals engine 128 updates the asset loaded into the vertical according to the received input.

Figure 2:
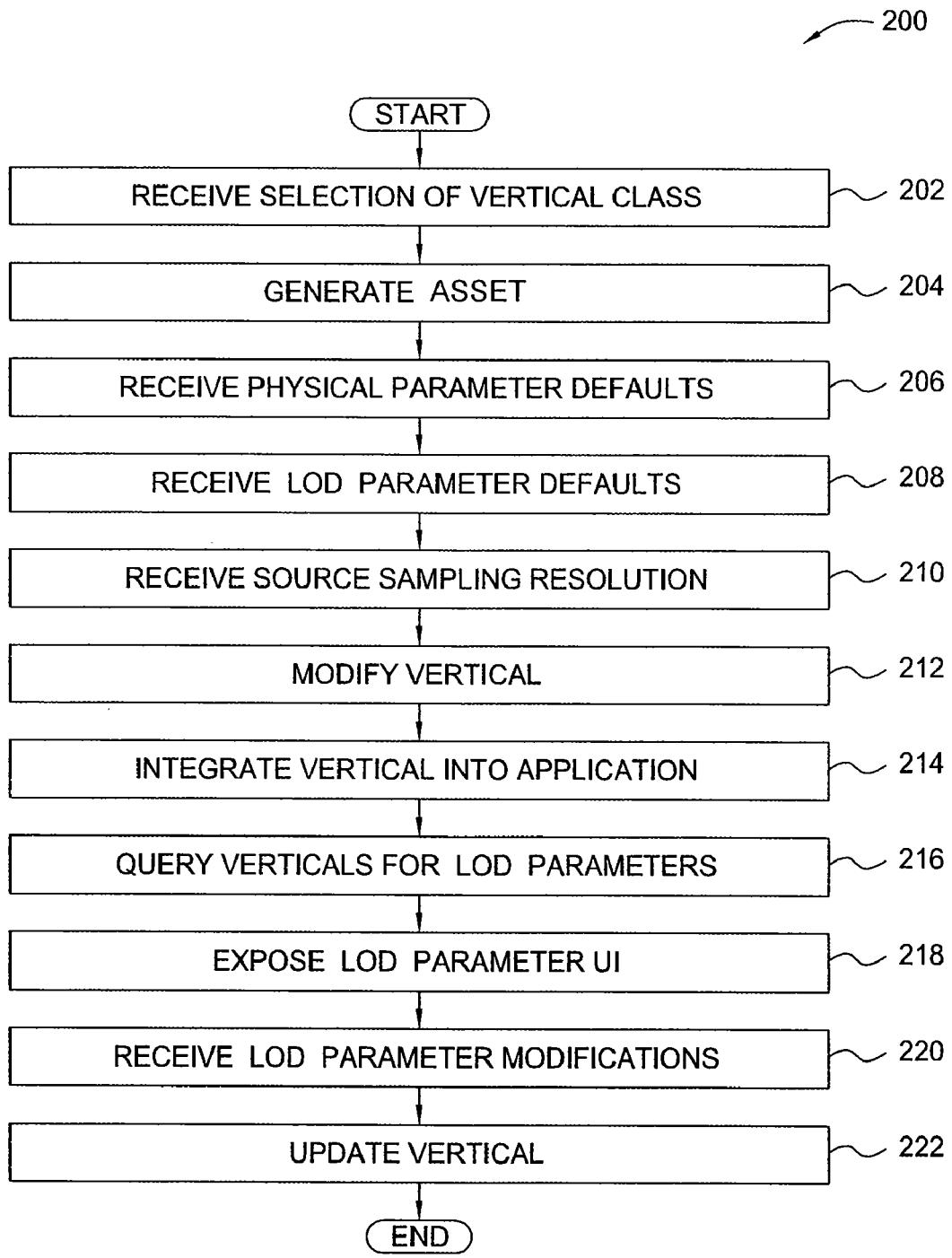
FIG. 2 is a flowchart of method steps for generating and modifying an asset, according to one embodiment of the invention.

FIG. 2 is a flowchart of method steps for generating and modifying a vertical, according to one embodiment of the invention. Persons skilled in the art will understand that, even though the method 200 is described in conjunction with the system of FIG. 1, any system configured to perform the method steps, in any order, is within the scope of the invention.

As shown, the method 200 begins at step 202, where the verticals engine 128 receives a selection of a specific class of vertical. This class could be, for example, a destructible mesh vertical or a conglomerate vertical. At step 204, the verticals engine 128 generates an asset that is a subclass of the selected class. The asset inherits some or all of the physical parameters and some or all of the LOD parameters from the selected class. In one embodiment, the verticals engine 128 receives additional selections of physical parameters and LOD parameters that are not associated with the selected class. These additional selections are then associated with the asset. In another embodiment, the verticals engine 128 receives input that specifies the predominant type of physical simulation performed by the vertical. This input may specify that the vertical predominantly performs, for example, a rigid body simulation or a fluid simulation, among others.

At step 206, the verticals engine 128 receives a selection of the physical parameter defaults. The physical parameters defaults define the initial appearance and initial physical parameters of the asset. At step 208, the verticals engine 128 receives a selection of LOD parameter defaults. The default values of the LOD parameters define the maximum values of the LOD parameters. The LOD parameters define the initial number of physical calculations required to perform physical simulations associated with the asset. The default LOD parameters may be scaled down to reduce this number of physics calculations.

At step 210, the verticals engine 128 receives a source sampling resolution for the vertical. The source sampling resolution defines the minimum size of the time steps used to perform physics simulations associated with the vertical and the asset. Accordingly, a high source sampling resolution (smaller time steps) results in a more accurate physical simulation, while a low source sampling resolution (larger time steps) results in a less accurate physical simulation. In one embodiment, the source sampling resolution is an LOD parameter that may be altered to modify the accuracy of the physical simulation and, thus, the number of physical calculations required to perform the physical simulation At step 212, the verticals engine 128 modifies the asset with the selected physical parameters and selected LOD parameters and stores the additional vertical and the additional asset in the verticals library 126. At step 214, the verticals engine 128 loads an asset into a selected vertical and integrates the selected vertical into the user application 120. The selected vertical may be a vertical originally stored in the verticals library 126 and/or a recently authored vertical stored in the verticals library 126. Additionally, the asset loaded into the vertical may be provided with the verticals library 126 or recently authored. At step 216, the verticals engine 128 queries each of the selected verticals to determine the LOD parameters of the assets associated with that vertical. At step 218, the verticals engine 128 generates a LOD parameter UI (not shown) and exposes the LOD parameters via the LOD parameter UI. The LOD parameter UI may be integrated into the user application 120 or, alternatively, may be generated separately from the user application 120. The LOD parameter UI may be exposed to a developer or to a user of the user application 120. A developer may wish, for example, to test the quality of assets associated with one or more verticals using varying LODs, while a user of user application 120 may wish to scale one or more integrated verticals to improve the performance of the user application 120 or the image quality of the images generated by the application 120.

At step 220, the LOD parameter UI receives modifications to zero or more of the LOD parameters of assets associated with the selected verticals. These modifications could specify an increased LOD for a particular LOD parameter or a decreased LOD for a particular LOD parameter. At step 222, the verticals engine 128 causes the vertical to update the asset, and the vertical then re-reloads the asset The user application may then update a virtual scene that includes the asset. The method then terminates.

Figure 3:
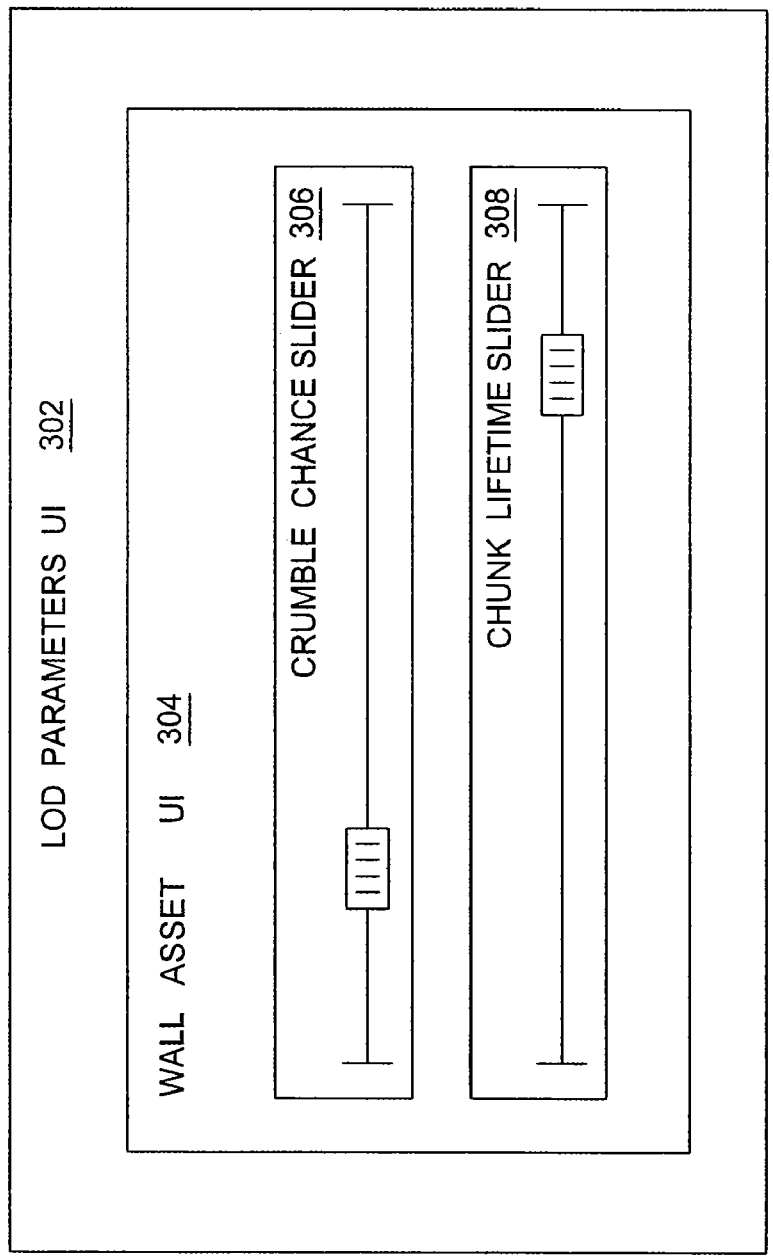
FIG. 3 is a conceptual diagram illustrating a level of detail parameters user interface, according to one embodiment of the invention.

FIG. 3 is a conceptual diagram illustrating an LOD parameters UI 302, according to one embodiment of the invention. Although the embodiment of FIG. 3 shows the LOD parameter UI 302 configured to allow modifications to the LOD parameters associated with a wall asset loaded into a destructible mesh vertical, those skilled in the art understand that the LOD parameters UI 302 may be used to modify the LOD parameter settings of some or all of the assets associated with verticals integrated into the user application 120. However, the LOD parameters UI 302 is described below relative to the specific embodiment shown.

As shown, the LOD parameters UI 302 includes a wall asset UI 304 which includes a crumble chance slider 306 and a fragment lifetime slider 308. A wall asset is loaded into the destructible mesh vertical to create a virtual wall that is modeled with the destructible mesh vertical. The destructible mesh vertical may then be scaled to modify the properties of the wall asset. The crumble chance slider 306 may be manipulated to increase or decrease the probability that fragments ejected from the virtual wall will then crumble into smaller fragments. A user or developer may modify the crumble chance LOD setting with the crumble chance slider 306 to scale the destructible mesh vertical to different computing platforms. For example, a computer system lacking a PPU may not be capable of performing high-quality physics computations. Consequently, the user or developer may wish to decrease the crumble chance LOD so that fewer fragments are created by the destructible mesh vertical when the virtual wall is destroyed, thereby reducing the number of physics calculations required when the wall is destroyed.

The fragment lifetime slider 308 may be manipulated to increase or decrease the lifetime of fragments ejected from the wall. For example, the user or developer may modify the fragment lifetime LOD setting with the fragment lifetime slider 308 to decrease the length of time each fragment is simulated. By reducing the simulation time of each fragment, additional physics calculations are avoided. The user or developer may wish to avoid such computational overhead when executing the user application 120 and the PSDK 124 on a computing platform that lacks, for example, the ability to perform high-quality physics calculations.

The LOD parameters UI 302 can be used to scale assets associated with the verticals integrated into the user application 120 before execution of the user application 120 or while the user application 120 is idle. For example, when the user application 120 is a video game, the LOD parameters UI 302 is accessible to the user or developer before the video game is executed or when the video game has been paused. The PSDK 124 also allows assets to be dynamically scaled during the execution of the user application 120 via the DSE 130, as described in greater detail below in FIG. 4.

Figure 4:
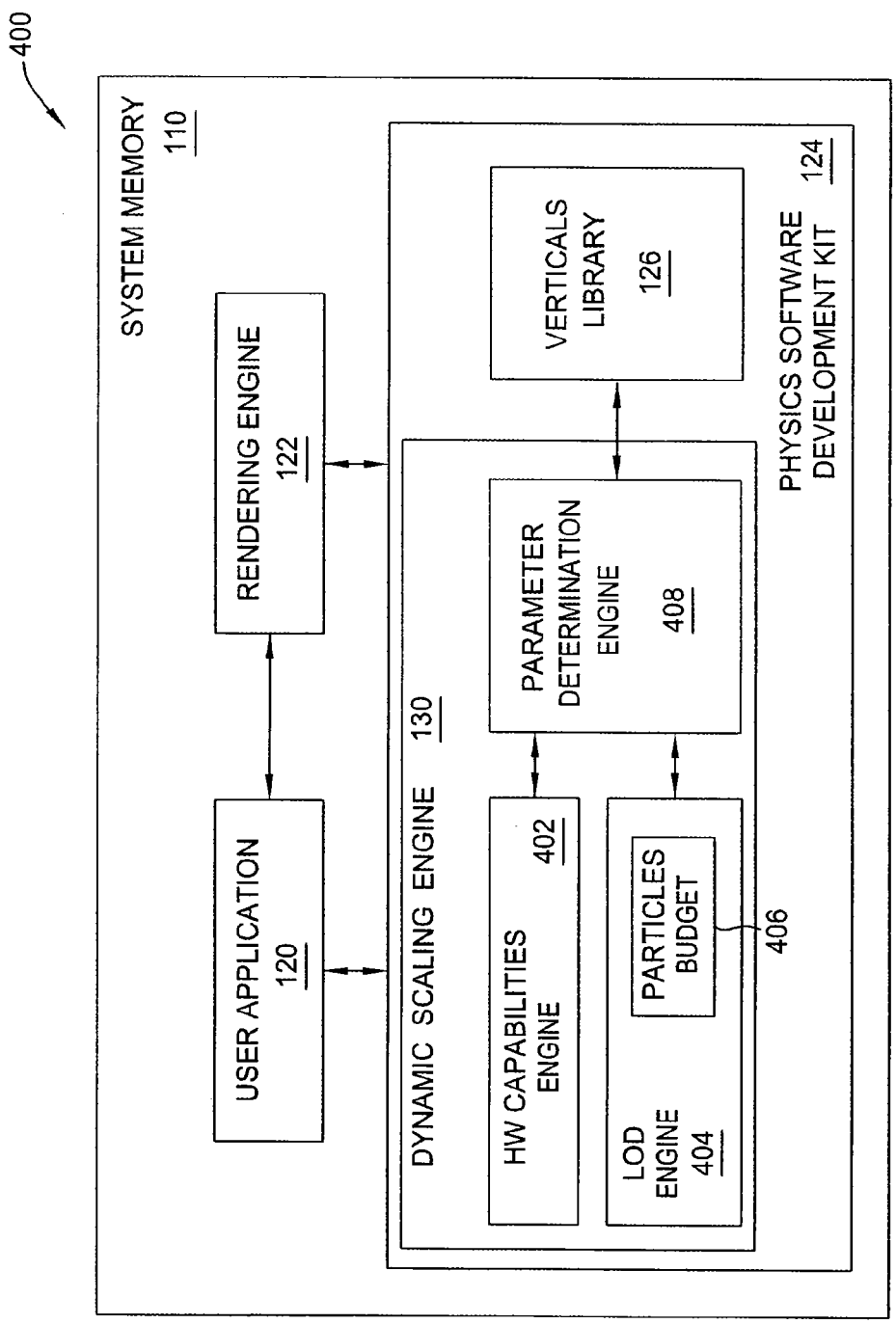
FIG. 4 is a block diagram illustrating the dynamic scaling engine of FIG. 1 within the computer system of FIG. 1, according to one embodiment of the invention.

FIG. 4 is a block diagram illustrating the DSE 130 of FIG. 1 within the computer system 100, according to one embodiment of the invention. Again, the DSE 130 is a software application that executes within the PSDK 124 and is configured to dynamically scale assets associated with verticals integrated into the user application 120. As shown, the DSE 130 includes a hardware capabilities engine (HCE) 402, a LOD engine 404 and a parameter determination engine (PDE) 406.

The DSE 130 uses the LOD engine 404 and the PDE 408 to scale the assets during the execution of the user application 120 based on the physics processing capabilities associated with the computer system 100. The HCE 402 is configured to determine a physics processing index (PPI) that represents the physics processing capabilities of the computer system 100. In one embodiment, the HCE 402 receives user input that specifies the PPI. In another embodiment, the HCE 402 determines the PPI of the computer system 100 based on a library of PPIs associated with a number of different computer systems. In so doing, the HCE 402 examines the computer system 100 and determines the specification details of the different hardware components included within the computer system 100, such as the PPU 106. The specification details of a particular hardware component include, among other things, the vendor of the hardware component and the version of that hardware component. Based on the specification details of the different components within the computer system 100, the HCE 402 selects the computer system included in the library that is most similar to the computer system 100. The corresponding PPI of the selected computer system is used as the PPI of the computer system 100.

In yet another embodiment, the PPI comprises one or more components, and the HCE 402 performs one or more benchmark tests to determine each component of the PPI. The HCE 402 executes a set of preset physics simulations and measures the time required by the computer system 100 to perform those simulations. The set of physics simulations may include several different types of physics simulations so that different types of physics processing capabilities are measured. For example, a first physics simulation may be a rigid body simulation while a second physics simulation may be a fluid simulation. The HCE 402 then computes the PPI based on a combined result of each benchmark test. Alternatively, the HCE 402 may generate a PPI that specifies individual performance measures for each type of benchmark test. For example, the PPI could have two components. A first component of the PPI could represent the capacity of the computer system 100 to perform physics simulations involving rigid bodies, while a second component of the PPI could represent the capacity of the computer system 100 to perform physics simulations involving fluids.

In a further embodiment, the frame rate of the user application 130 may be used to dynamically determine the PPI. When the frame rate of the user application 130 is high, the computer system 100 may be assumed to be efficiently performing physics computations. Conversely, a low frame rate may indicate that generating each frame requires an above-average number of physics computations. As each frame is generated, a new frame rate may be computer, and the PPI may be updated based on the current frame rate of the user application 130, thus providing a dynamic estimate of the physics processing capabilities of the computer system 100.

The LOD engine 404 is configured to generate a particles budget 406 based on the PPI. The particles budget 406 defines the number of independent particles the user application 120 is capable of processing when the computer system 100 generates a given frame. Accordingly, the particles budget 406 sets an upper limit to the total number of particles generated across all integrated verticals. Since the particles budget 406 is linearly related to the PPI, the particles budget 406 may be computed using a linear equation. When the PPI comprises multiple indices, each index may be incorporated into the linear equation. When the PPI is dynamically determined based on the frame rate of the user application 120, the particles budget is dynamically updated after each generated frame.

The PDE 408 is configured to modify the LOD parameters of each integrated vertical so that the particles budget 406 is not exceeded when the integrated verticals simulate loaded assets. More specifically, the PDE 408 identifies each of the verticals integrated into the user application 120 and the particles generated by assets associated with each vertical. The particles occupy a virtual scene within the user application 120, a portion of which is rendered to create an image. A view frustum defines the portion of the virtual scene that is rendered to create the image. The PDE 408 identifies the view frustum associated with the user application 120 and removes particles that are not included within the view frustum. Since such particles do not contribute to the rendered image, they are perceptually irrelevant to a user viewing the image. The resulting reduced number of particles comprises visible particles (i.e., those particles contributing to the rendered image).

The PDE 408 determines whether the number of visible particles exceeds the particles budget 406. When the particles budget is exceeded, the PDE 408 selects a subset of the visible particles for delayed instancing. In one embodiment, the PDE 408 selects a subset of the visible particles for delayed instancing based on a measure of perceptual relevance. For example, visible particles located close to the viewpoint may be considered more perceptually relevant than visible particles located further away from the viewpoint. When a visible particle is selected for delayed instancing, that particle is rendered as part of a subsequent frame. When the user application 120 generates the subsequent frame, the PDE 408 allows the selected visible particle to be rendered only if the total number of visible particles to be rendered for that frame is less than the particles budget 406. In one embodiment, the PDE 408 defines a limit to the number of times a visible particle may be selected for delayed instancing after which that visible particle is deleted. Selecting subsets of visible particles for delayed instancing in this fashion ensures that the total number of visible particles rendered is constrained by the number of visible particles specified by the particles budget 406.

In addition to performing delayed instancing, the PDE 408 also scales integrated verticals that contribute visible particles so that the particles budget 406 is not exceeded. More specifically, the PDE 408 identifies and modifies the LOD parameters associated with each integrated vertical to adjust the total number of visible particles generated by assets associated with those verticals. In one embodiment, the PDE 408 scales each vertical based on the distance of an asset associated with the vertical to the viewpoint. When the asset is near the viewpoint, that asset may contribute more noticeable particles to the image when simulated with the vertical; in such instances, the realism of the image may be preserved by increasing the LOD of the vertical. Likewise, when the asset is not located near the viewpoint, the vertical may be scaled down without a noticeable loss of realism.

In another embodiment, the PDE 408 detects the type of physical simulation predominantly performed by each vertical. The PDE 408 then scales each vertical so that LOD parameters that influence the detected physical simulation are not scaled down, while LOD parameters that do not influence the detected physical simulation are scaled down.

In yet another embodiment, the PPI comprises multiple indices that each represents the physics processing capabilities of the computer system 100 relative to a different type of physical simulation. The PDE 408 identifies each of the LOD parameters of a particular vertical with one of the different types of physics simulations, and scales that LOD parameter in proportion to the PPI index corresponding to that type of physics simulation. For example, the first PPI index may represent the capability of the computer system 100 to perform a rigid body simulation. The PDE 408 may identify one or more LOD parameters of a particular vertical that predominantly influence the quality of a rigid body simulation performed by the vertical. If the PPI index corresponding to a rigid body simulation indicates that the computer system 100 is highly capable of performing that simulation, then the identified LOD parameters are scaled up to take advantage of the capabilities of the computer system 100. Alternatively, if the computer system 100 provides below-average rigid body simulation capabilities, then the identified LOD parameters may be scaled down to avoid inefficient use of the computer system 100. Those skilled in the art will understand that this technique may be applied to scale the LOD parameters that predominantly influence any of the different types of physics simulations In another embodiment, the PDE 408 determines the likelihood that each integrated vertical will require a detailed physical simulation based on the execution context of user application 120. Returning to the wall example, when a virtual character is not carrying a weapon, the likelihood that a given wall will be destroyed by that character is relatively low. Accordingly, the LOD parameters of the destructible mesh vertical associated with the wall may be reduced and processor resources may thus be conserved. When the likelihood that the wall will be destroyed increases, the LOD parameters of the destructible mesh vertical associated with the wall may be increased accordingly.

Figure 5:
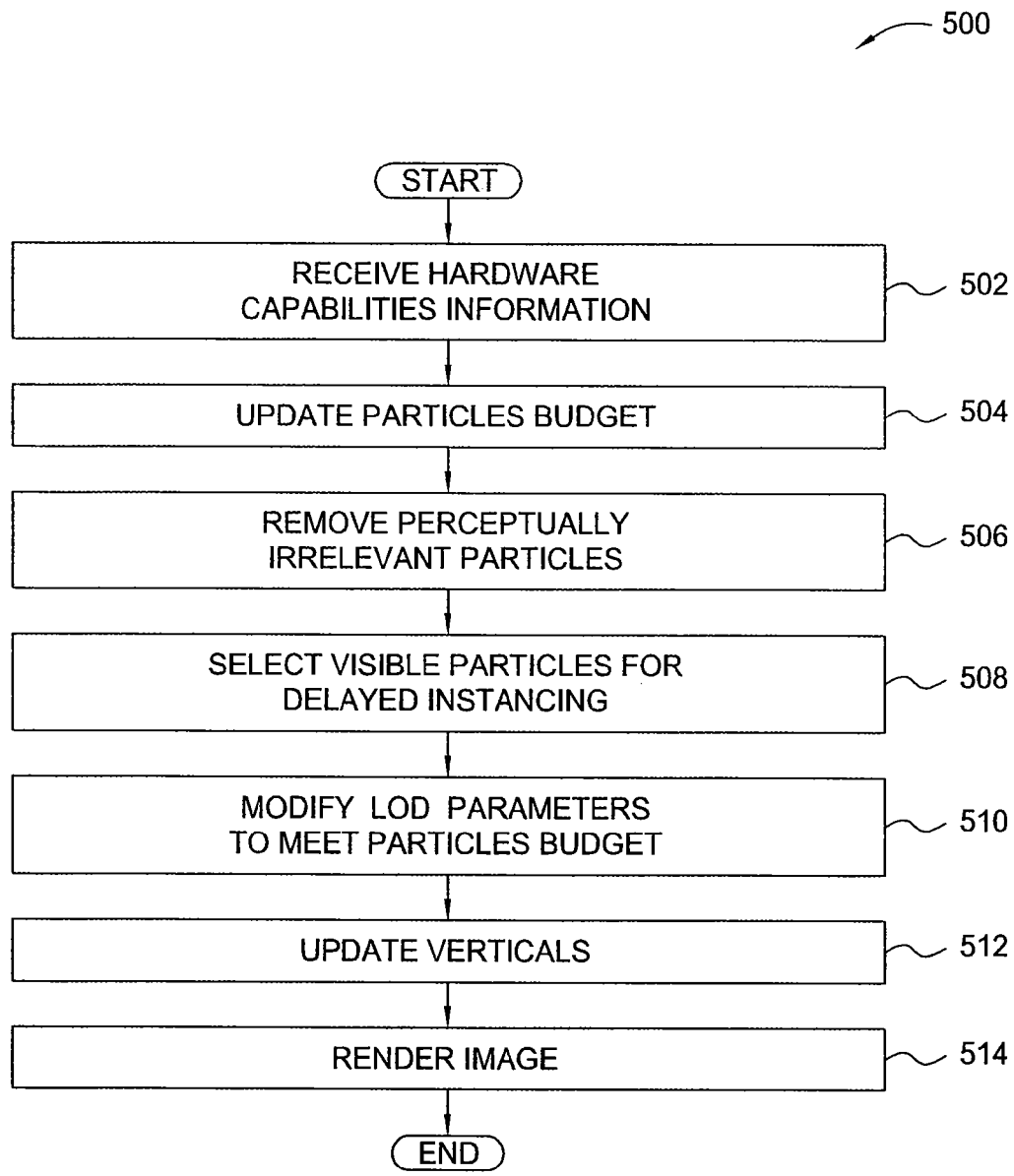
FIG. 5 is a flowchart of method steps for scaling a vertical, according to one embodiment of the invention.

FIG. 5 is a flowchart of method steps for scaling a vertical, according to one embodiment of the invention. Persons skilled in the art will understand that, even though the method 500 is described in conjunction with the systems of FIGS. 1 and 4, any system configured to perform the method steps, in any order, is within the scope of the invention.

As shown, the method 500 begins at step 502, where the HCE 402 receives the PPI of the computer system 100. In one embodiment the PPI is selected by a user. In another embodiment, the PPI is determined by comparing the configuration of the computer system 100 with a list that includes exemplary computing systems and the PPIs of each such exemplary computing system. Again, when computing system most similar to computing system 100 is selected, the PPI of that computing system is used as the PPI of the computing system 100. In yet another embodiment, the PPI of the computer system 100 is determined using a benchmark test. The benchmark test performs a set of physics processing simulations and measures the performance of the computer system 100 during each test. The performance data may then be used to generate a PPI. In yet a further embodiment, the PPI is determined dynamically based on the frame rate of the user application 120.

At step 504, the LOD engine 404 updates the particles budget 406. The LOD engine 404 calculates the maximum number of particles that can be simulated on the computer system 100 based on the PPI. When the PPI is determined dynamically, the LOD engine 404 updates the particles budget 406 dynamically.

At step 506, the PDE 408 examines particles that are generated by the user application 120 to produce a virtual scene. The PDE 408 identifies particles within the virtual scene that are not located within the view frustum. Particles located outside of the view frustum are not rendered and, thus, do not contribute to the image rendered from the virtual scene. These particles may be removed, thereby conserving processor resources while having little adverse effect on image quality. The remaining visible particles are generated by assets that are associated with verticals that may be scaled to increase or decrease the number of visible particles, while ensuring that the particles budget is not exceeded.

At step 510, the PDE 508 identifies and modifies the LOD parameters of the integrated verticals that include assets that contribute visible particles to the image being generated from the virtual scene. The LOD parameters determine the number of physics computations required to physically simulate each of these verticals. The LOD of a particular vertical may be reduced when, for example, one or more assets associated with that vertical are not located near the viewpoint and, thus, do not contribute highly noticeable particles. In one embodiment, the PDE 408 scales each vertical according to the type of physical simulation predominantly performed by that vertical. In another embodiment, the PDE 408 identifies the LOD parameters that predominantly influence a particular type of physical simulation, and then scales these LOD parameters according to the capacity of the computer system 100 to perform that type of physical simulation.

At step 512, the PDE 408 updates the assets associated with the integrated verticals with the new LOD parameter settings that were calculated in step 510. At step 514, the application 120 updates the visible particles in the virtual scene and renders an image using the rendering engine 122. The rendered image may then be output to one or more of the I/O modules 114. The method then terminates.

Figure 6:
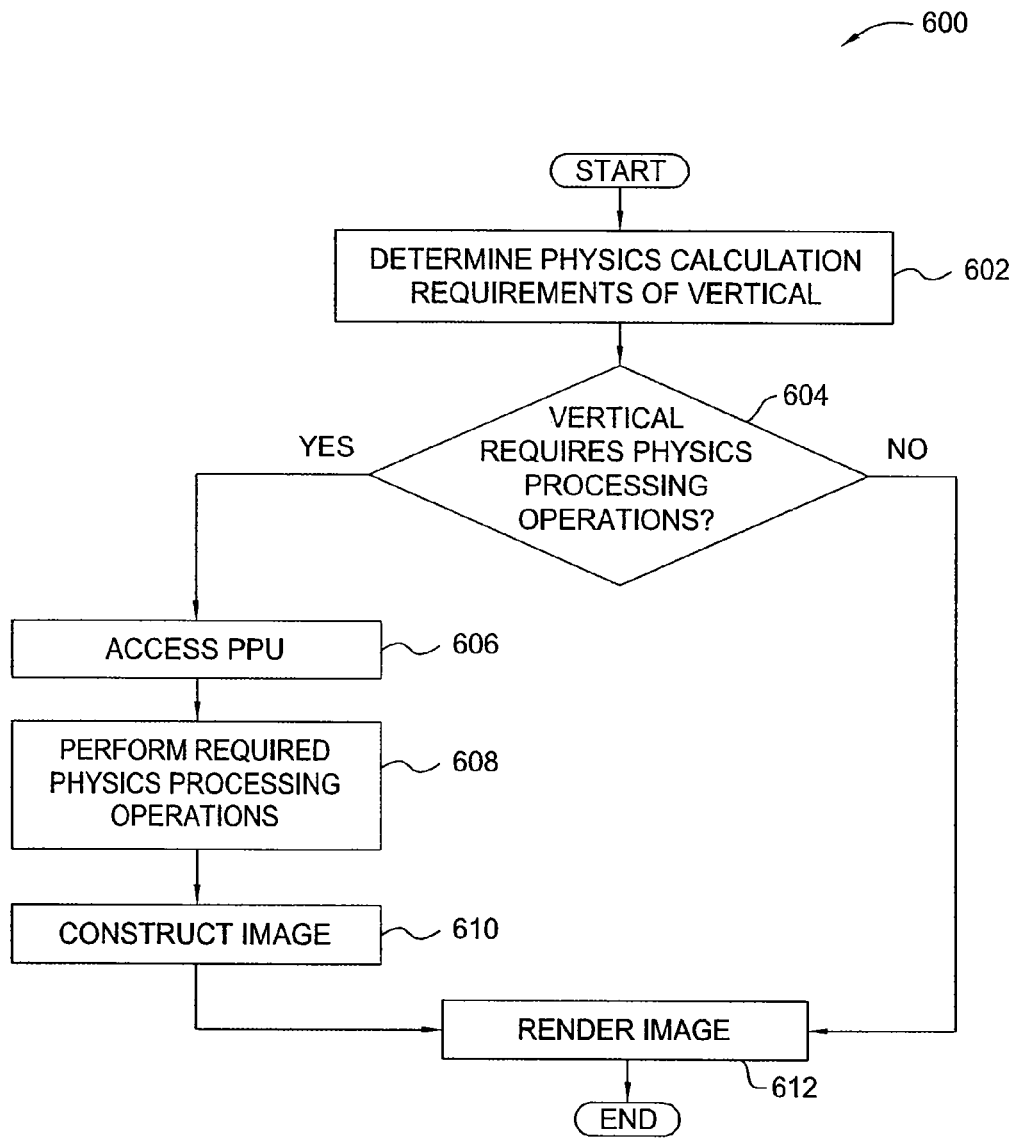
FIG. 6 is a flowchart of method steps for selectively offloading physics processing operations, according to one embodiment of the invention.

FIG. 6 is a flowchart of method steps for selectively offloading physics processing operations, according to one embodiment of the invention. Persons skilled in the art will understand that, even though the method 600 is described in conjunction with the systems of FIGS. 1 and 4, any system configured to perform the method steps, in any order, is within the scope of the invention.

A particular vertical integrated into the user application 120 may not always require physics operations, although these operations may still be performed. For example, a destructible mesh vertical may load a wall asset that crumbles into fragments. When these fragments contact the ground of the virtual scene, the fragments become stationary. Physics processing operations may be performed for the stationary fragments even though these fragments are immobile, thus wasting processor resources. Accordingly, in such instances, physics processing operations associated with particular verticals may be bypassed. The method 600 describes a technique for bypassing the PPU 106 when generating images using verticals.

As shown, the method 600 begins at step 602, where the POE 132 determines the physics processing requirements of a vertical integrated into the user application 120. The integrated vertical may or may not require physics processing operations depending on, among other things, the distance of one or more assets associated with the vertical to the viewpoint and/or the current position and velocity of assets associated with the vertical. Again, the destructible mesh vertical described above in FIG. 1 may generate fragments that initially require physics processing operations to simulate the trajectory of the fragments. However, once these fragments impact the ground and settle, physical simulations for the different fragments are no longer necessary.

At step 604, if the vertical does not require physics processing operations, then the POE 132 bypasses the PPU 106. Again, when the vertical does not require physics processing operations, an image of an asset associated with the vertical may be rendered without performing a physical simulation. At step 612, the user application 120 and the rendering engine 122 generate an image that includes an asset associated with the vertical.

If at step 604, the vertical does require physics processing operations, then the PSDK 124 generates physics processing operations for simulating the vertical based on the physical parameters of the vertical. At step 606, the PSDK 124 accesses the PPU 106 and transmits the physics processing operations to the PPU 106. At step 608, the PPU 106 performs the required operations. The physics processing operations may be used to provide, among other things, updated position information for assets associated with each vertical and/or the particles associated with those assets, collision information associated with the assets, or modifications to the appearance of the assets. The PPU 106 then returns the results of the physics processing operations, and the user application 120 is updated to reflect those results. At step 610, the user application 120 constructs an image that includes the physically-simulated assets as well as the assets that were not simulated. At step 612, the rendering engine 122 renders the constructed image. The method 600 then terminates.

Figure 7:
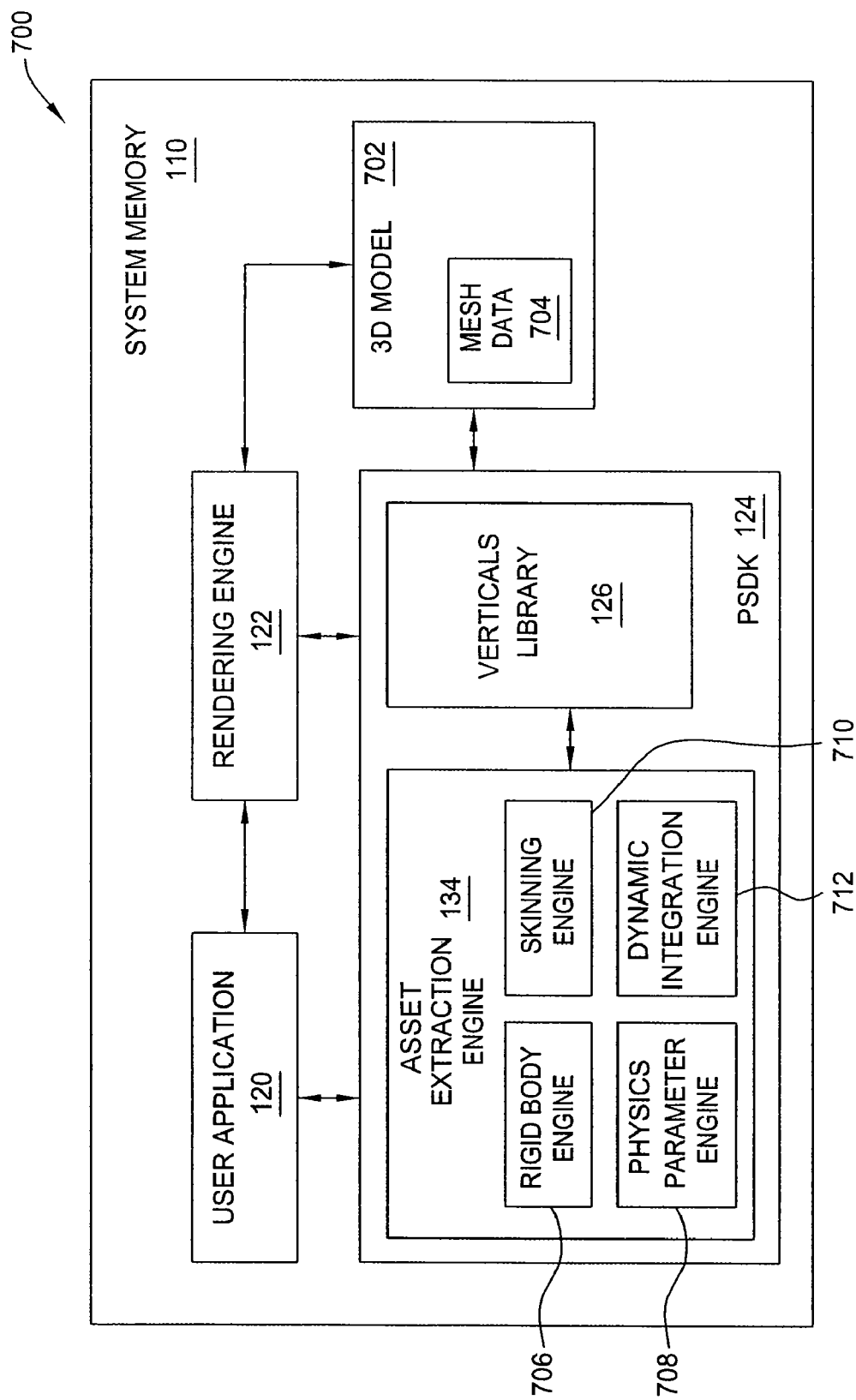
FIG. 7 is a block diagram illustrating the asset extraction engine of FIG. 1 within the computer system of FIG. 1, according to one embodiment of the invention.

FIG. 7 is a block diagram illustrating the AEE 134 of FIG. 1 within computer system 100, according to one embodiment of the invention. The AEE 134 is a software application that is configured to extract an asset from a 3D model 702 stored in the memory 110. The 3D model 702 is a data file that describes the appearance of a virtual object and includes mesh data 704 that describes the geometry of the virtual object. The 3D model 702 may also include surface data (not shown) that describes the surface properties of the virtual object, including coverage data and/or texture maps. The 3D model 702 may be integrated into the user application 120 or, alternatively, may simply be stored in the memory 110. When the 3D model 702 is integrated into the user application 120, the rendering engine 122 may render an image of the 3D model 702 with the mesh data 704 and the surface data. The 3D model 702 may be provided via one of the I/O devices 114, or the 3D model 702 may be downloaded to the system memory 110 from the internet via the internet connection 116. In various embodiments, the 3D model 702 may be a CAD file, a 3D drawing, a wireframe model, a SpeedTree® file, or an animation file, among others.

The AEE 134 is configured to access the 3D model 702 and to generate an asset based on the mesh data 704. The AEE 134 includes a rigid body engine (RBE) 706, a physics parameter engine (PPE) 708, a skinning engine 710 and a dynamic integration engine (DIE) 712. The RBE 706 examines the 3D model 702 and generates a rigid body hierarchy using the mesh data 704. The rigid body hierarchy specifies the various rigid bodies that make up the geometry of the 3D model 702 and, additionally, specifies joints that describe how each of those rigid bodies is connected to the other rigid bodies. In one embodiment, the rigid body hierarchy is generated using the rigid body vertical. The RBE 706 transmits the rigid body hierarchy to the PPE 708.

The PPE 708 examines the rigid body hierarchy and estimates the physical parameters of each rigid body. This process may include, for example, estimating the mass and volume of each rigid body and/or calculating the moment of inertia of the rigid body for a particular axis of rotation. The PPE 708 also estimates the properties of the joints between each rigid body. This process may include modeling each joint as a spring and estimating physical parameters associated with the spring. The PPE 708 also extracts integration information using the 3D model 702. The integration information specifies how the 3D model 702 is positioned within a virtual scene generated by the user application 120. For example, integration information could specify that the 3D model 702 is attached to the ground in a scene within a video game. The PPE 708 associates the physical parameters and the integration information with the rigid body hierarchy to produce a physical model. The physical model represents the 3D model 702 and may be used to simulate the motion of the 3D model 702 relative to the virtual scene. The PPE 708 transmits the physical model to the skinning engine 710.

The skinning engine 710 computes skinning data that defines the surface properties of the physical model. The skinning data, based on the surface data stored in the 3D model 702, is computed so that the physical model remains covered during a simulation. The skinning engine 710 applies the skinning data to the surface of the physical model to generate an "extracted asset" that may be loaded into a vertical and simulated. The extracted asset reproduces the appearance of the 3D model 702 and also approximates the physical motion of the 3D model 702. The extracted asset may be stored in the verticals library 126 and, like the existing assets stored in the verticals library 126, may be loaded into a vertical that is then integrated into the user application 120 and simulated.

In one embodiment, the AEE 134 generates the extracted asset using one or more existing verticals stored in the vertical library 126. For example, if the extracted asset represents a tree, then the branches of the tree could be generated based on the destructible mesh vertical. Such a configuration would allow the branches of the tree to be broken during a simulation. Additionally, the leaves of the tree could be generated using an emitter vertical to provide a simulation of the leaves falling off of the tree.

Once the asset is extracted from the 3D model 702, the DIE 712 may dynamically integrate a vertical associated with the asset into the user application 120, replacing the 3D model 702 or, alternatively, dynamically integrate the 3D model 702 into the user application 120, replacing the vertical. These dynamic integrations are managed by the DIE 712 and may arise under different circumstances. For example, when the user application 120 is a video game that includes a tree, either a 3D model or the vertical associated with the asset extracted from the 3D model could be used to represent the tree. When the 3D model is integrated into the video game, the DIE 712 may integrate the vertical to represent the tree, replacing the 3D model of the tree, if a virtual character in the video game reaches a certain proximity to the tree. The DIE 120 integrates the vertical into the video game because physical simulations of the tree may be required.

The DIE 712 may also integrate the vertical when a virtual character interacts with a trigger object within the virtual scene. Returning to the above example, if the virtual character picks up a weapon that could be used to destroy the tree, then the DIE 712 may integrate the vertical into the video game and simulate the extracted asset. This dynamic integration is performed to anticipate the destruction of the tree, which would require a physical simulation. The trigger object could be defined by a developer.

The DIE 712 may also dynamically integrate the 3D model 702, replacing the vertical, when physics simulations are not required. Returning again to the above example, if the virtual character puts down the weapon or moves a sufficient distance away from the tree, then a physical simulation of the tree may not be necessary. Accordingly, the DIE 712 could cause the 3D model 702 to be integrated into the video game, replacing the vertical. This type of dynamic integration may conserve processing resources because physical calculations that require the PPU 106 can be avoided.

Figure 8:
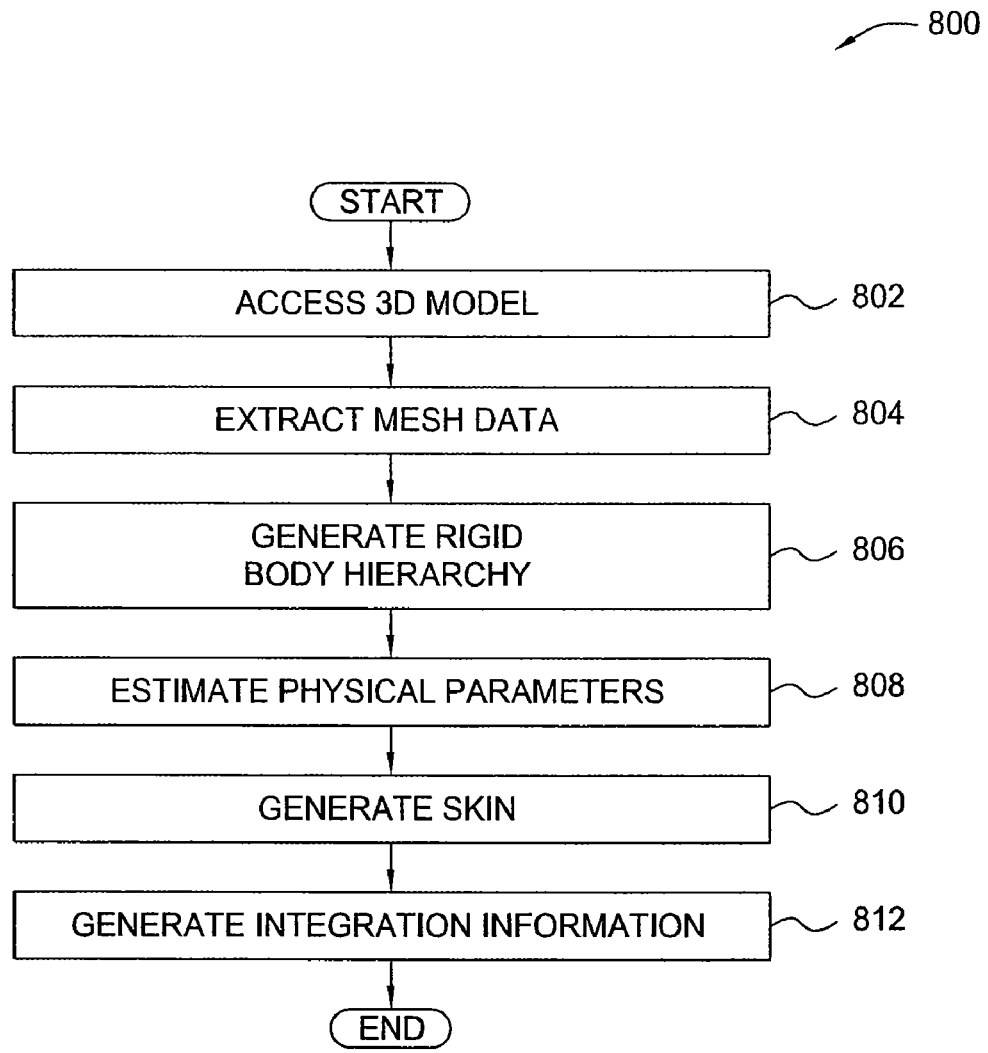
FIG. 8 is a flowchart of method steps for extracting an asset from a three-dimensional (3D) model, according to one embodiment of the invention.

FIG. 8 is a flowchart of method steps for extracting an asset from a 3D model, according to one embodiment of the invention. Persons skilled in the art will understand that, even though the method 800 is described in conjunction with the systems of FIGS. 1 and 7, any system configured to perform the method steps, in any order, is within the scope of the invention.

As shown, the method 800 begins at step 802, where the RBE 706 accesses the 3D model 702. Again, the 3D model may be stored in the system memory 110, received from one of the I/O devices 114, or downloaded from the internet via the internet connection 116. Also, the 3D model 702 may be a CAD file, a wireframe model or another type of file that includes mesh data 704, and the mesh data 704 describes the geometry of the 3D model 702.

At step 804, the RBE 706 extracts the mesh data 704 from the 3D model 702. The mesh data 704 may include data that describes the connections between different parts of the geometry of the 3D model 702. At step 806, the RBE 706 generates a rigid body hierarchy that identifies the different rigid bodies described by the mesh data 704 and defines different joints connecting the various rigid bodies.

At step 808, the PPE 708 receives the rigid body hierarchy from the RBE 706 and estimates various physical parameters of both the rigid bodies and the joints specified in the rigid body hierarchy. The PPE 708 may, for example, estimate the mass and volume of each rigid body, calculate the moment of inertia of a particular rigid body for a particular axis of rotation, or model each joint as a spring with specific physical parameters, among others. The PPE 708 may also identify rigid bodies that do not require physical simulations because, for example, the rigid bodies are smaller than some minimum size. The PPE 708 also generates integration information that specifies how the 3D model is integrated into the virtual scene created by the user application 120. The PPE 708 then uses the estimated physical parameters and the integration information to generate a physical model of the 3D model 702.

At step 810, upon receiving the physical model, the skinning engine 710 computes skinning data that defines the surface properties of the physical model makes the physical model appear realistic when simulated, among other things. The skinning engine 710 applies the skinning data to the physical model to generate an extracted asset. Again, the extracted asset may be loaded into a vertical to represent the 3D model 702. This vertical may be integrated into the user application 120 to simulate the extracted asset.

At step 812, the DIE 712 generates dynamic integration information for the extracted asset. The dynamic integration information specifies conditions when the DIE 712 dynamically integrates a vertical and the asset into the user application 120, replacing the 3D model 702. The dynamic integration information also specifies conditions when the DIE 712 dynamically integrates the 3D model 702 into the user application 120, replacing the vertical. Again, the dynamic integration information may be based on the proximity of a virtual character to a virtual object in the virtual scene. The virtual object may be represented by either the 3D model or the extracted asset. The dynamic integration may also be based on the interaction of the virtual character with a trigger object in the virtual scene. Once the dynamic integration information is generated and associated with the extracted asset, the DIE 712 may dynamically integrate either the vertical and the extracted asset or the 3D model on which the extracted asset is based, as the case may be. The method 800 then terminates.

Figure 9:
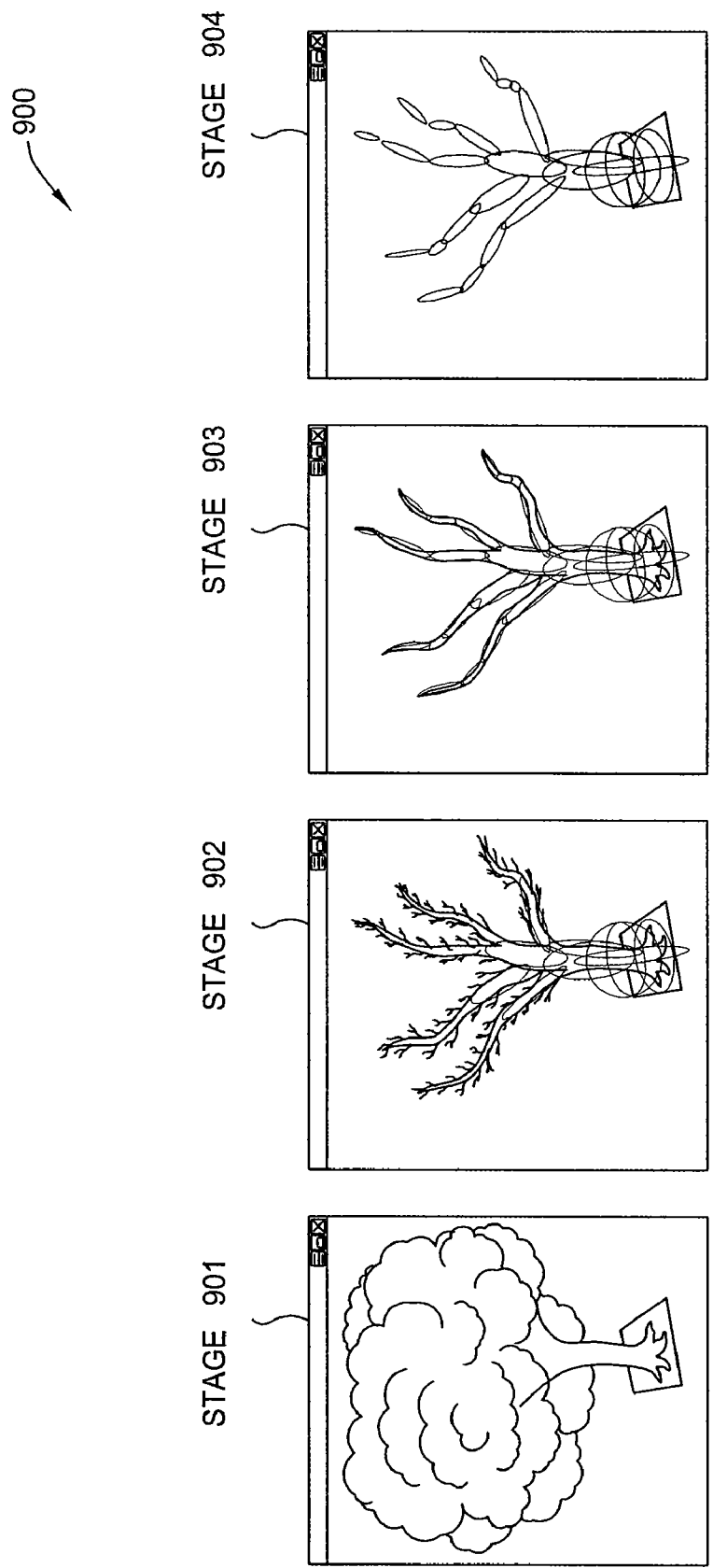
FIG. 9 is a conceptual diagram illustrating stages of vertical extraction, according to one embodiment of the invention.

FIG. 9 is a conceptual diagram illustrating stages of asset extraction, according to one embodiment of the invention. As shown, stages 901-904 illustrate sequential steps of extracting a tree asset from a 3D model of a tree. Stage 901 illustrates the 3D model of the tree as rendered by the rendering engine 122. The 3D model of the tree includes a trunk, branches and leaves, and is attached to the ground. The geometry of the tree is generated using mesh data associated with the 3D model.

At stage 902, the RBE engine 706 examines the mesh data 704 and approximates the rigid bodies that comprise the geometry of the 3D model 702. The RBE engine 706 then identifies attachment points between the different rigid bodies. These attachment points are illustrated within stage 902 as ovoid shapes. The RBE 706 uses this information to generate a rigid body hierarchy. The rigid body hierarchy specifies each rigid body included in the 3D model 702, as well as the attachments between each rigid body.

At stage 903, the PPE 708 estimates physics parameters for the major rigid bodies comprising the rigid body hierarchy. This process may include estimating physical properties of the different rigid bodies as well as the physical properties of the joints that connect the different rigid bodies. The PPE 712 may also identify rigid bodies in the rigid body hierarchy for which physical properties do not need to be estimated, such as the smaller branches and twigs of the tree. These identified rigid bodies may not contribute significantly to the physical simulation and, therefore, do not need to be included in the simulation. The PPE 708 also generates integration information that specifies how the 3D model 702 is integrated into a virtual scene. This information may specify a particular rigid body that attaches to the ground of the virtual scene, such as the rigid body encapsulated by the spherical shape. The PPE 708 combines the rigid body hierarchy, the estimated physical parameters and the integration information to generate a physical model of the 3D model.

At stage 904, the skinning engine 710 generates skinning data for the physical model so that surfaces of the physical model potentially exposed during simulation are adequately covered. The skinning data may be based on surface data extracted from the 3D model. The skinning engine 710 applies the skinning data to the physical model to generate an extracted asset. The extracted asset may then be stored in the verticals library 126 and/or loaded into a vertical, such as the destructible mesh vertical, and integrated into the user application 120.

Figure 10:
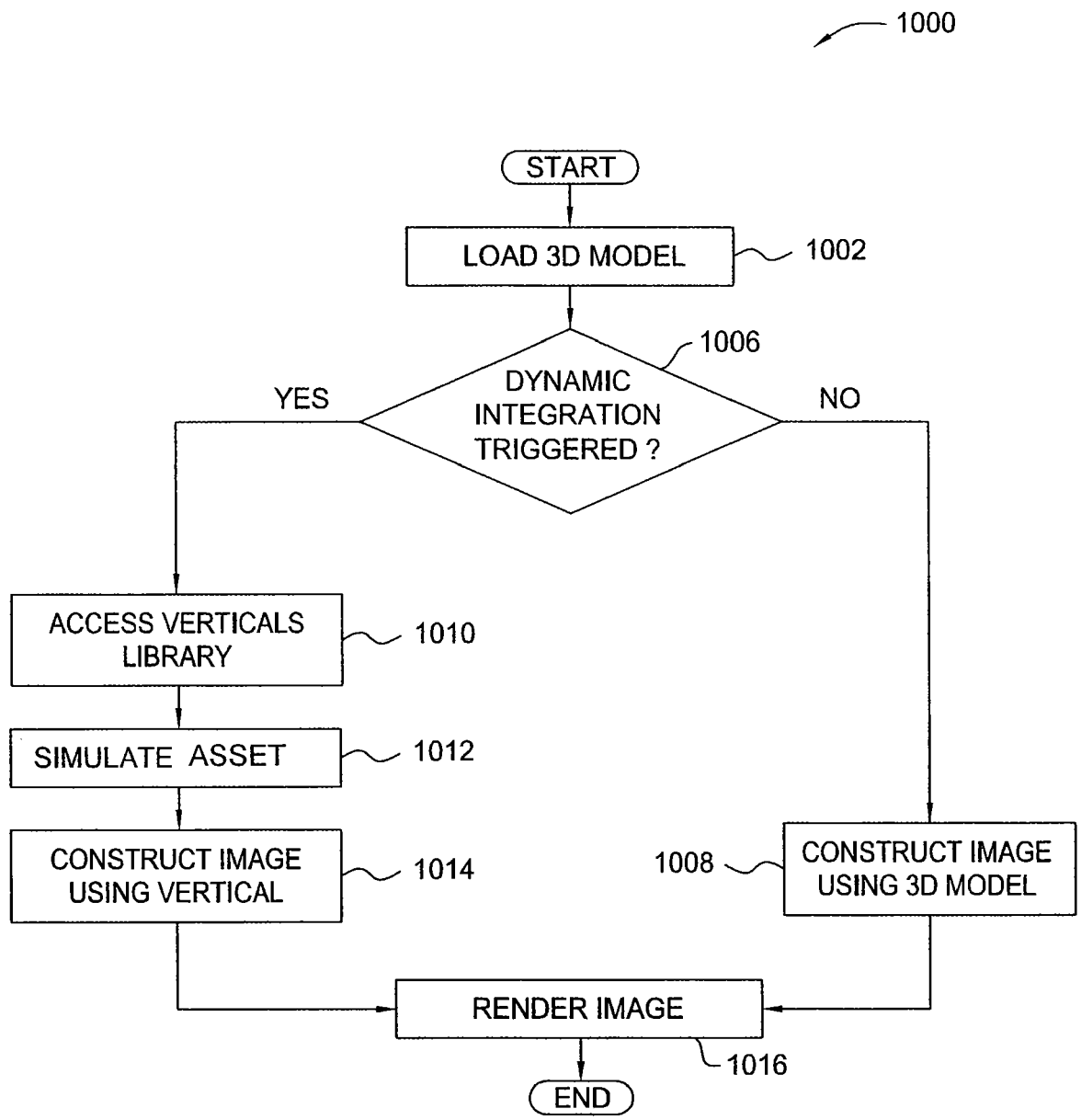
FIG. 10 is a flowchart of method steps for dynamically integrating a vertical, replacing a 3D model already integrated into a user application, according to one embodiment of the invention.

FIG. 10 is a flowchart of method steps for dynamically integrating a vertical, replacing a 3D model already integrated into the user application 120, according to one embodiment of the invention. Persons skilled in the art will understand that, even though the method 1000 is described in conjunction with the systems of FIGS. 1 and 7, any system configured to perform the method steps, in any order, is within the scope of the invention.

As shown, the method 1000 begins at step 1002, where the user application 120 integrates the 3D model 702 into a virtual scene generated by the user application 120. The 3D model 702 thus becomes part of the virtual scene generated by the user application 120. At step 1006, the DIE 712 determines whether a dynamic integration is triggered. As described herein, if a dynamic integration is triggered, then the DIE 712 integrates the vertical associated with the asset extracted from the 3D model 702 into the user application 120, replacing the 3D model 702. Again, a dynamic integration may be triggered by the proximity of different objects within the virtual scene, including a virtual character controlled by a user. A dynamic integration may also be triggered when a virtual character interacts with a trigger object in the virtual scene. If a dynamic integration is not triggered, then the method 1000 proceeds to step 1008, where the rendering engine 122 constructs an image of the virtual scene that includes the 3D model 702. The method 1000 then proceeds to step 1016, where the rendering engine 122 renders the constructed image for display. The rendering engine 122 may access the GPU 102 to expedite the graphics processing operations required by rendering operations. The rendered pixels may be output to one of the I/O devices 114 and displayed to a user.

Returning now to step 1006, if a dynamic integration is triggered, then the method 1000 proceeds to step 1010, where the DIE 712 accesses the verticals library 126 and retrieves the asset extracted from the 3D model. The DIE 712 loads the asset into the associated vertical and integrates the vertical into the user application 120, replacing the 3D model 702, and notifies the user application 120 when the dynamic integration is complete. At step 1012, the integrated vertical simulates the asset. The asset may interact with other assets within the user application 120. These types of interactions are also simulated. At step 1014, the rendering engine 122 constructs an image that includes the extracted asset, and then the method 1000 proceeds to step 1016, as described above.

In sum, the physics software development kit (PSDK) provides scalable physics simulations known as "verticals." Verticals may be integrated into a user application to provide physically realistic simulations. These simulations may then be used to generate high-quality images. Verticals may be included in a verticals library within the PSDK and may also be generated by a user. Each vertical may load different "assets" to represent different real-world or imaginary objects. Verticals include a set of level of detail (LOD) parameters that may be scaled to provide higher-quality or lower-quality physics simulations depending on a user preference. For example, when the PSDK is executes on a computing platform with low physics processing capabilities, the LOD parameters of each vertical may be manually scaled down so that the computing platform is capable of handling the physics processing workload. When the PSDK executes on a computing platform that includes a physics processing unit such as a PhysX™ chip, the LOD parameters of each vertical may be scaled up to take advantage of the increased physics processing power, thus providing higher-quality physical simulations and better quality display images.

The PSDK is configured to scale verticals integrated into the user application dynamically using different techniques. Each vertical may be scaled based on the relative importance of assets associated with the vertical or, alternatively, based on the capacity of the computing platform to perform simulations associated with the vertical. The PSDK is also configured to select verticals that do not require simulation and render images associated with these verticals without performing a physical simulation. This technique allows the PSDK to optimize the use of physics processing power.

The PSDK allows assets to be extracted from existing three-dimensional (3D) models and loaded into verticals to simulate the physical dynamics of those 3D models. The PSDK extracts mesh data from a 3D model and generates a rigid body structure that represents the 3D model. The PSDK estimates physical parameters associated with the model and generates skinning information. The PSDK also determines the configuration of the 3D model within a virtual scene generated by the user application. The asset may be loaded into a vertical which is then be dynamically integrated into the user application. Additionally, the PSDK may selectively integrate either the 3D model or the vertical associated with the asset extracted from that 3D model into the user application based on, among other things, user interaction with the asset or the importance of the asset to the user application.

Advantageously, different verticals associated with the PSDK may be integrated into a user application without requiring extensive computer programming. Such functionality simplifies the application development process. Further, since verticals provide physically realistic content, they can be implemented to generate high-quality display images quite effectively. Different assets may also be loaded into verticals to produce different visual effects. In addition, the PSDK allows the verticals library to be expanded by extracting assets from existing 3D models, thus simplifying the authoring process. The PSDK optimizes the use of available processor resources by scaling verticals in proportion to those resources. The PSDK provides further optimizations by selectively offloading certain processing tasks when those tasks are not necessary.

Embodiments of the invention may be implemented as program products for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

We claim:

1. A computer-implemented method for modifying a first level of detail (LOD) parameter associated with a vertical that defines one or more physical simulations for a graphics object contributing particles to a graphics scene, the method comprising:
    identifying the first LOD parameter associated with the vertical, wherein a value of the first LOD parameter influences a number of particles contributed to the graphics scene by the graphics object during the one or more physical simulations;
    receiving a physics processing index (PPI) comprised of one or more components that indicates the capability of a first computer system to perform physical simulations;
    generating a particles budget based on the PPI, wherein the particles budget defines a maximum number of particles to be included in the graphics scene;
    modifying the first LOD parameter to ensure that the total number of particles in the graphics scene upon execution of the one or more physical simulations on the computer system is less than the maximum number of particles defined by the particles budget; and
    providing, via a processing unit, the modified vertical, directly or indirectly, to a software application for rendering an image of the graphics scene for storage or display.

2. The computer-implemented method of claim 1, wherein the received PPI is associated with a second computer system having a configuration similar to a configuration of the first computer system, and the received PPI and information related to the configuration of the second computer system are stored in a library.

3. The computer-implemented method of claim 1, wherein the received PPI is based on an execution time of one or more benchmark physical simulations executed on the first computer system.

4. The computer-implemented method of claim 3, wherein each of the one or more benchmark physical simulations predominantly performs a different type of physics simulation and defines a different PPI component.

5. The computer-implemented method of claim 4, wherein the different types of physics simulations include a rigid body simulation, a fluid simulation, a destructible mesh simulation and a cloth simulation.

6. The computer-implemented method of claim 4, wherein a plurality of LOD parameters are associated with the vertical, and wherein the step of modifying the first LOD parameter comprises identifying the type of physics simulation predominant in the one or more physical simulations defined by the vertical, identifying the first LOD parameter as predominantly influencing the identified type of physics simulation, increasing the first LOD parameter, and decreasing all remaining LOD parameters in the plurality of LOD parameters associated with the vertical.

7. The computer-implemented method of claim 4, wherein a plurality of LOD parameters are associated with the vertical, and the step of modifying the first LOD parameter comprises determining the type of physics simulation that each LOD parameter in the plurality of LOD parameters predominantly influences, scaling the first LOD parameter in proportion to a PPI component corresponding to a first physics simulation predominantly influenced by the first LOD parameter, and scaling each remaining LOD parameter in the plurality of LOD parameters in proportion to a PPI component corresponding to the physics simulation predominantly influenced by the remaining LOD parameter.

8. The computer-implemented method of claim 1, wherein the received PPI is based on a current frame rate associated with the first computer system.

9. The computer-implemented method of claim 1, wherein a first asset associated with the graphics object is derived from the vertical and inherits the first LOD parameter from the vertical, and the first LOD parameter is modified based on a position of the graphics object within a view frustum associated with the graphics scene.

10. The computer-implemented method of claim 1, further comprising the step of selecting one or more particles for delayed instancing, wherein the selected particles are rendered in a subsequent frame of the graphics scene.

11. The computer-implemented method of claim 1, further comprising the step of deleting particles that are not included within a view frustum associated with the graphics scene.

12. A non-transitory computer-readable medium including instructions that, when executed by a processing unit, cause the processing unit to modify a first level of detail (LOD) parameter associated with a vertical that defines one or more physical simulations for a graphics object contributing particles to a graphics scene, by performing the steps of:
    identifying the first LOD parameter associated with the vertical, wherein a value of the first LOD parameter influences a number of particles contributed to the graphics scene by the graphics object during the one or more physical simulations;
    receiving a physics processing index (PPI) comprised of one or more components that indicates the capability of a first computer system to perform physical simulations;
    generating a particles budget based on the PPI, wherein the particles budget defines a maximum number of particles to be included in the graphics scene;
    modifying the first LOD parameter to ensure that the total number of particles in the graphics scene upon execution of the one or more physical simulations on the computer system is less than the maximum number of particles defined by the particles budget; and
    providing the modified vertical, directly or indirectly, to a software application for rendering an image of the graphics scene for storage or display.

13. The non-transitory computer-readable medium of claim 12, wherein the received PPI is associated with a second computer system having a configuration similar to a configuration of the first computer system, and the received PPI and information related to the configuration of the second computer system are stored in a library.

14. The non-transitory computer-readable medium of claim 12, wherein the received PPI is based on an execution time of one or more benchmark physical simulations executed on the first computer system.

15. The non-transitory computer-readable medium of claim 14, wherein each of the one or more benchmark physical simulations predominantly performs a different type of physics simulation and defines a different PPI component.

16. The non-transitory computer-readable medium of claim 15, wherein the different types of physics simulations include a rigid body simulation, a fluid simulation, a destructible mesh simulation and a cloth simulation.

17. The non-transitory computer-readable medium of claim 15, wherein a plurality of LOD parameters are associated with the vertical, and wherein the step of modifying the first LOD parameter comprises identifying the type of physics simulation predominant in the one or more physical simulations defined by the vertical, identifying the first LOD parameter as predominantly influencing the identified type of physics simulation, increasing the first LOD parameter, and decreasing all remaining LOD parameters in the plurality of LOD parameters associated with the vertical.

18. The non-transitory computer-readable medium of claim 15, wherein a plurality of LOD parameters are associated with the vertical, and the step of modifying the first LOD parameter comprises determining the type of physics simulation that each LOD parameter in the plurality of LOD parameters predominantly influences, scaling the first LOD parameter in proportion to a PPI component corresponding to a first physics simulation predominantly influenced by the first LOD parameter, and scaling each remaining LOD parameter in the plurality of LOD parameters in proportion to a PPI component corresponding to the physics simulation predominantly influenced by the remaining LOD parameter.

19. The non-transitory computer-readable medium of claim 12, wherein the received PPI is based on a current frame rate associated with the first computer system.

20. The non-transitory computer-readable medium of claim 12, wherein a first asset associated with the graphics object is derived from the vertical and inherits the first LOD parameter from the vertical, and the first LOD parameter is modified based on a position of the graphics object within a view frustum associated with the graphics scene.

21. The non-transitory computer-readable medium of claim 12, further comprising the step of selecting one or more particles for delayed instancing, wherein the selected particles are rendered in a subsequent frame of the graphics scene.

22. The non-transitory computer-readable medium of claim 12, further comprising the step of deleting particles that are not included within a view frustum associated with the graphics scene.

23. A computing device, comprising:
    a processing unit; and
    a memory coupled to the processing unit and including a software application and a dynamic scaling engine, wherein the dynamic scaling engine is configured to:
        identify a first level of detail (LOD) parameter associated with a vertical that defines one or more physical simulations for a graphics object contributing particles to a graphics scene, wherein a value of the first LOD parameter influences a number of particles contributed to the graphics scene by the graphics object during the one or more physical simulations,
        receive a physics processing index (PPI) comprised of one or more components that indicates the capability of a first computer system to perform physical simulations,
        generate a particles budget based on the PPI, wherein the particles budget defines a maximum number of particles to be included in the graphics scene,
        modify the first LOD parameter to ensure that the total number of particles in the graphics scene upon execution of the one or more physical simulations on the computer system is less than the maximum number of particles defined by the particles budget, and
        provide the modified vertical, directly or indirectly, to the software application for rendering an image of the graphics scene for storage or display.

* * * * *